(12) United States Patent
Kuramoto

(10) Patent No.: US 8,581,295 B2
(45) Date of Patent: Nov. 12, 2013

(54) SEMICONDUCTOR LIGHT-EMITTING DIODE

(75) Inventor: Kyosuke Kuramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1527 days.

(21) Appl. No.: 11/773,470

(22) Filed: Jul. 5, 2007

(65) Prior Publication Data
US 2008/0017878 A1 Jan. 24, 2008

(30) Foreign Application Priority Data

Jul. 18, 2006 (JP) ................................ 2006-196260
Jun. 15, 2007 (JP) ................................ 2007-158344

(51) Int. Cl.
*H01L 33/00* (2010.01)
(52) U.S. Cl.
USPC .............................. 257/103; 257/94; 257/431
(58) Field of Classification Search
USPC ............. 257/431, 432, 435, 436, 103, 22, 97, 257/211
See application file for complete search history.

(56) References Cited

U.S. PATENT DOCUMENTS

| | | | |
|---|---|---|---|
| 4,864,370 A | 9/1989 | Gaw et al. | |
| 6,649,942 B2 * | 11/2003 | Hata et al. | 257/103 |
| 6,734,515 B1 * | 5/2004 | Tadatomo et al. | 257/431 |
| 6,858,882 B2 * | 2/2005 | Tsuda et al. | 257/103 |
| 2002/0000558 A1 | 1/2002 | Morimoto | |
| 2005/0098801 A1 * | 5/2005 | Ikeda et al. | 257/211 |

FOREIGN PATENT DOCUMENTS

| | | |
|---|---|---|
| JP | 56-78473 U | 6/1984 |
| JP | 3-53856 U | 5/1991 |
| JP | 5-38921 U | 5/1993 |
| JP | 8-250769 A | 9/1996 |
| JP | 2003-124517 A | 4/2003 |
| JP | 2003-133589 A | 5/2003 |
| JP | 2005-166840 | 6/2005 |

OTHER PUBLICATIONS

Japanese Patent Office, Office Action (May 8, 2012).
Japanese Patent Office, English Translation of Office Action, (Dec. 27, 2011).

* cited by examiner

*Primary Examiner* — Steven Loke
*Assistant Examiner* — David Goodwin
(74) *Attorney, Agent, or Firm* — Leydig, Voit & Mayer, Ltd.

(57) ABSTRACT

A semiconductor light-emitting diode includes an electrically conductive substrate transmissive to light-emitting wavelengths, and semiconductor layers including a light-emitting layer, on the substrate. A principal-surface electrode is located on the semiconductor layers and a rear-surface electrode having an opening is located on the rear surface of the substrate. The width of the opening is L, the distance between the rear-surface electrode and the light-emitting layer is t, $L \leq 2t$, and the rear-surface electrode covers no more than 40% of the rear surface of the substrate.

20 Claims, 5 Drawing Sheets region where current is not supplied

SEMICONDUCTOR LIGHT-EMITTING DIODE

BACKGROUND OF THE INVENTION

1. Field of the Invention

The present invention relates to a nitride semiconductor light-emitting diode fabricated on a light transmissive and conductive substrate, such as a GaN substrate, and more specifically to a semiconductor light-emitting diode that can achieve a high light-emitting efficiency by uniformly supplying a current to a light-emitting layer and raising the light extraction efficiency.

2. Background Art

In recent years, the research and development of blue, white or ultraviolet semiconductor light-emitting diodes (LEDs) using a nitride-containing III-V group compound semiconductor, such as AlInGaN, have been carried out, and already in practical use (for example, refer to Japanese Patent Laid-Open No. 2005-166840). The mainstream of present semiconductor light-emitting diodes is of a type wherein the crystals of a nitride semiconductor are grown on a sapphire substrate because of the low costs thereof.

However, since there is a large lattice mismatch between the sapphire substrate and the crystals of a nitride semiconductor grown on the substrate, when the nitride semiconductor is directly grown on the sapphire substrate, a very large number of threading dislocations having a density of $10^9$ to $10^{10}$ cm$^{-3}$ or higher are present in the light-emitting layer. Since these threading dislocations produce non-light-emitting recombination centers of carriers in the light-emitting layer, the light-emitting efficiency is lowered.

Therefore, a method for reducing threading dislocations by growing a buffer layer at a low temperature on a sapphire substrate has been used. However, even if this method is used, the density of threading dislocations is not so small, and is about $10^7$ cm$^{-3}$. On the other hand, the density of threading dislocations of presently marketed GaN substrate is about $10^5$ cm$^{-3}$, and the further reduction of the density of threading dislocations is expected in the future. Therefore, to improve light-emitting efficiency, the use of GaN substrates is highly effective.

As the methods to mounting a semiconductor light-emitting diode of the type wherein a p-type electrode and an n-type electrode are formed on the principal surface and the rear surface, respectively, the following two methods can be used. One is a method wherein die bonding is performed with the substrate side, i.e., the n-electrode side down and light is extracted from the principal-surface side. On the contrary, the other is a method wherein die bonding is performed with the principal-surface side, i.e., the p-electrode side down and light is extracted from the rear-surface side.

FIG. 6 is a sectional view showing a conventional semiconductor light-emitting diode of the type wherein the rear surface of a substrate is die-bonded and light is extracted from the principal surface of the substrate. As FIG. 6 shows, on a substrate 1, as semiconductor layers, an n-type AlGaN clad layer 2 having a thickness of 1.0 μm and an Al composition ratio of 0.07; a light-emitting layer 3 composed of four InGaN barrier layers (not shown) each having a thickness of 7 nm and an In composition ratio of 0.02 and three InGaN well layers each having a thickness of 5 nm and an In composition ratio of 0.10; a p-type AlGaN clad layer 4 having a thickness of 100 nm and an Al composition ratio of 0.07; and a p-type GaN contact layer 5 having a thickness of 20 nm are laminated. On the rear surface of the substrate 1, an n-electrode 6 composed of Ti/Au is formed, and on the GaN contact layer 5, p-electrodes 7 composed of Pd/Au are formed. Openings are provided in the p-electrodes 7, and light is extracted mainly from this portion.

Here, if the distances L between the p-electrodes 7 are excessively longer than the distance t between the p-electrodes 7 and the light-emitting layer 3, the quantity of current supplied to the light-emitting layer 3 becomes uneven, and the regions where current is not supplied are produced to lower the light-emitting efficiency. In order to prevent this, the distances L between the p-electrodes 7 are reduced. Thereby, since there is only a high-resistance thin p-type semiconductor layer between the light-emitting layer 3 and the p-electrodes 7, the current spreading in the lateral direction produced when current flows from the p-electrodes 7 to the light-emitting layer 3 is minimized.

The distance t between the p-electrodes 7 and the light-emitting layer 3 in the conventional semiconductor light-emitting diode is 1 μm or shorter. Consequently, the current spreading in the lateral direction is at largest several micrometers. Therefore, to prevent uneven injection of current the opening width L of the p-electrodes 7 must be several micrometers or less.

However, when the opening width L of the electrodes 7 was reduced, as Fig. 7 shows, there was a problem wherein a part of the light generated from the light-emitting layer was reflected or absorbed by the p-electrode 7 causing the lowering of the light emitting efficiency.

To solve this problem, as FIG. 8 shows, there is a method to reduce the reflection and absorption of light by using a light transmissive electrode 8 as the p-electrode. However, even in this case, the light is reflected and absorbed, and when the light emitting wavelength of a semiconductor light-emitting diode is short, a serious problem arises. Also when the electrode is thin, since the resistance of the electrode elevates, the quantity of current lowers to the location far from the wire for current supply, and the uniform current supply is difficult.

Furthermore, as FIG. 9 shows, there is a method to extract light from the rear surface by forming an n-electrode 6 on the portion from which a part of the semiconductor layer has been etched of f and mounting with the principal surface side facing down. However, since the n-electrode 6 becomes apart from the p-electrode 7, it is difficult to uniformly supplying the current. In addition, since a part of the light-emitting layer 3 is etched off, the area of the light emitting region is reduced. Furthermore, since the distance between the n-electrode 6 and the p-electrode 7 is shortened, there is a problem wherein it is difficult to die-bond with both electrodes insulated.

SUMMARY OF THE INVENTION

To solve the problems as described above, it is an object of the present invention to provide a semiconductor light-emitting diode that can achieve a high light emitting efficiency by uniformly supplying a current to a light emitting layer and by raising the efficiency of light extracting.

According to one aspect of the present invention, a semiconductor light-emitting diode according to the present invention includes a conductive substrate light transmissive to light-emitting wavelengths, a semiconductor layer including a light-emitting layer, formed on the substrate; a principal-surface electrode formed on the semiconductor layer; and a rear-surface electrode having an opening, formed on the rear surface of the substrate; wherein when the width of the opening is L, and the distance between the rear-surface electrode and the light-emitting layer is t, L≤2 t; and the percentage of the area of the rear-surface electrode to the area of the rear surface of the substrate is 40% or less.

According to the present invention, a high light emitting efficiency can be achieved by uniformly supplying a current to a light emitting layer and by raising the efficiency of light extracting.

DETAILED DESCRIPTION OF THE PREFERRED EMBODIMENTS

First Embodiment

Figure 1:
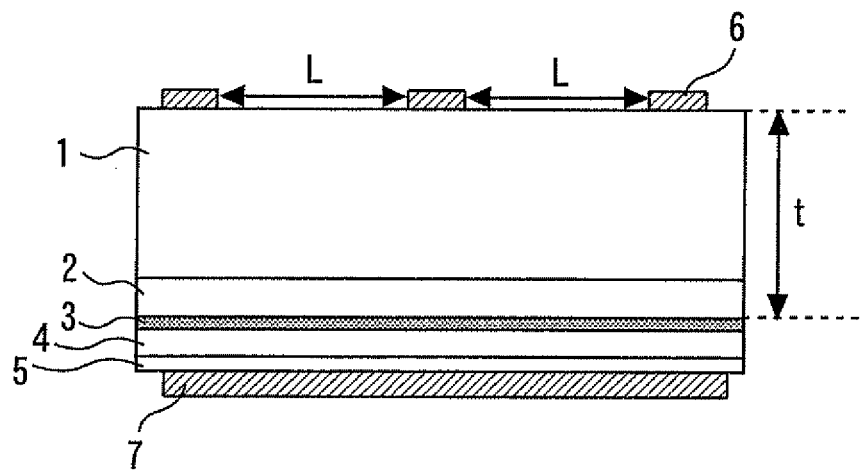
FIG. 1 is a sectional view showing a semiconductor light-emitting diode according to a first embodiment of the present invention.

FIG. 1 is a sectional view showing a semiconductor light-emitting diode according to a first embodiment of the present invention. A GaN substrate 1 is a conductive substrate light transmissive to light-emitting wavelengths, and the thickness thereof is made to be 99 μm by polishing. On the GaN substrate 1, as semiconductor layers, an n-type AlGaN clad layer 2 having a thickness of 1.0 μm and an Al composition ratio of 0.07; a light-emitting layer 3 composed of four InGaN barrier layers each having a thickness of 7 nm and an In composition ratio of 0.02 not shown and three InGaN well layers each having a thickness of 5 nm and an In composition ratio of 0.10; a p-type AlGaN clad layer 4 having a thickness of 100 nm and an Al composition ratio of 0.07; and a p-type GaN contact layer 5 having a thickness of 20 nm are laminated.

A p-electrode 7 (principal-surface electrode) composed of Pd/Au is formed on the substantially entire surface of the GaN contact layer 5, and an n-electrode 6 (rear-surface electrode) composed of Ti/Au is formed on the rear surface of the substrate 1. The semiconductor light-emitting diode is mounted with the p side thereof facing down. The n-electrode 6 is provided with openings, and light is extracted mainly from these portions.

Figure 2:
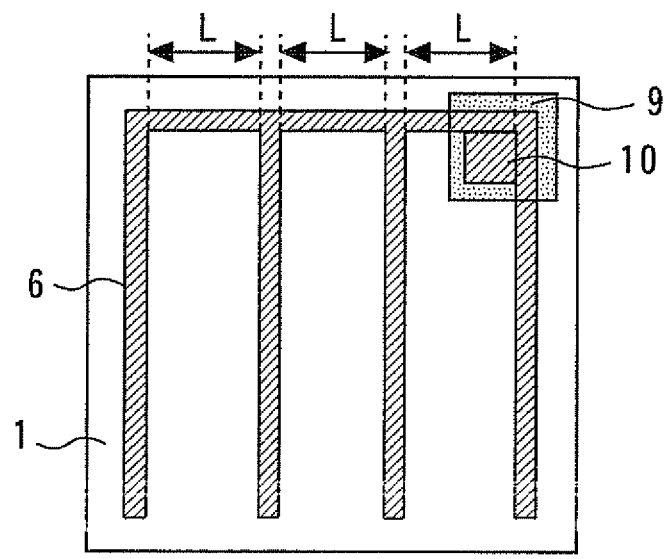
FIG. 2 is a diagram of a semiconductor light-emitting diode according to a first embodiment of the present invention viewed from the rear surface side of the substrate.

FIG. 2 is a diagram of a semiconductor light-emitting diode according to a first embodiment of the present invention viewed from the rear surface side of the substrate. The size of the element is 400 μm×400 μm. The n-electrode 6 is comb shaped, the width of the n-electrode 6 is 20 μm, and the width of each opening is 100 μm.

An electrode pad 10 for bonding wires is formed, and an $SiO_2$ insulating film 9 is formed between the electrode pad 10 and the GaN substrate 1. The size of the electrode pad 10 is 50 μm×50 μm, and the size of the $SiO_2$ insulating film 9 is 60 μm×60 μm.

Next, a method for manufacturing a semiconductor light-emitting diode according to embodiments of the present invention will be described. First, on a GaN substrate 1 whose surface has been cleaned by thermal cleaning or the like, an n-type AlGaN clad layer 2 doped with Si, which is an n-type dopant, is grown with a metal organic chemical vapor deposition (MOCVD) method. Next, a light emitting layer 3 composed of an Si-doped InGaN well layer, a p-type AlGaN clad layer 4 doped with Mg, which is a p-type dopant, and a p-type GaN contact layer 5 are sequentially laminated. Here, the growing temperatures of these layers are, for example, 1000° C. for the n-type AlGaN clad layer 2, 740° C. for the n-type InGaN light emitting layer 3, and 1000° C. for the p-type GaN clad layer 5.

After the above-described crystal growth has been completed, a resist is applied onto the entire surface of the wafer, and a resist pattern of a predetermined shape corresponding to the shape of the p-electrode 7 is formed by lithography. Next, a Pt film and an Au film are sequentially formed on the resist pattern by vacuum vapor deposition, and the resist and the electrode film on the resist are removed by a lift-off method to form a p-electrode 7 of a desired shape.

Next, the $SiO_2$ insulating film 9 underneath the electrode pad 10 is formed by vacuum vapor deposition, and a resist pattern of a predetermined shape corresponding to the shape of the n-electrode 6 is formed by lithography. Next, Ti film and an Au film are sequentially formed on the entire surface of the resist pattern by vacuum vapor deposition, and the resist and the electrode film on the resist are removed by a lift-off method to form an n-electrode 6 of a desired shape.

Next, the p-electrode 7 and the n-electrode 6 are subjected to an alloying treatment for the ohmic contact. Then, chips are produced from the GaN substrate 1 by cleavage or dicing. Thereby, the semiconductor light-emitting diode according to embodiments of the present invention is manufactured.

Figure 3:
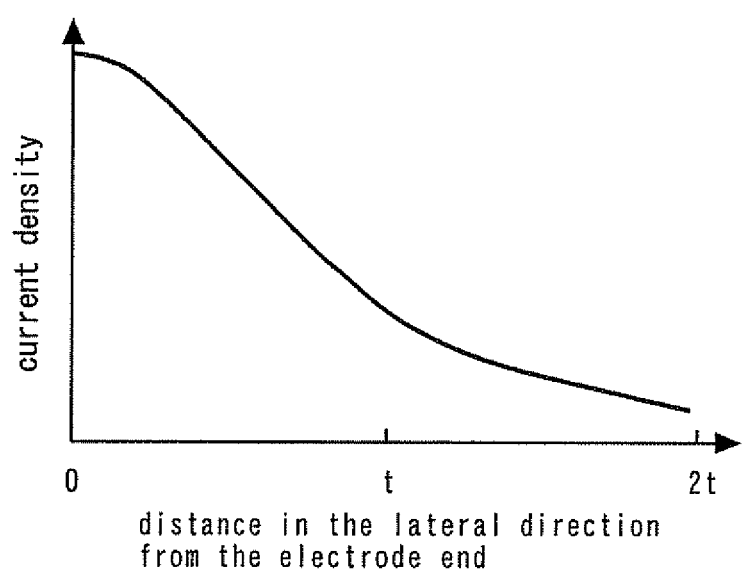
FIG. 3 is a graph showing the relationship between the distance in the lateral direction from the electrode end of an n-electrode and the current density of the current supplied to the light emitting layer from the n-electrode.

FIG. 3 is a graph showing the relationship between the distance in the lateral direction from the electrode end of an n-electrode 6 and the current density of the current supplied to the light emitting layer 3 from the n-electrode 6. When this relationship and the fact that current is also supplied from the adjacent n-electrode 6 are considered, it is known that if the width L of an opening of the n-electrode 6 is about 2 t, a current is uniformly supplied to the light emitting layer 3. Specifically, as FIG. 3 shows, if the distance from the n-electrode 6 is 2 t or less, the current density does not become zero. Therefore, if the distance L between adjoining n-electrodes 6 is 2 t or less, current is supplied from each of two n-electrodes 6 separated by the distance L, and consequently, current can be supplied to the light-emitting layer 3 uniformly to some extent. Therefore, if the width L of an opening of the n-electrode 6 is L≤2 t, the current can be uniformly supplied to the light emitting layer 3. However, L≤1.5 t is preferable, and L≤1.0 t is more preferable because the current density becomes substantially uniform.

Although the smaller the width L of the opening of the electrode 6, the lower the efficiency of light extraction, if the area of the n-electrode 6 is reduced by reducing the width thereof, the efficiency of light extraction can be raised. Then, if the proportion of the area of the n-electrode 6 is not more than 40% the area of the rear surface of the substrate 1, the efficiency of light extraction can be sufficiently raised. However, the area of the n-electrode 6 is preferably not more than 25%, more preferably not more than 15% the area of the rear surface of the substrate 1.

In addition, since light extraction is difficult from the portion of the electrode pad 10, by forming an $SiO_2$ insulating film 9 underneath the electrode pad 10, the external quantum efficiency can further be improved. In this case, if the proportion of the area of the n-electrode 6 formed on the region other than on the $SiO_2$ insulating film 9 to the area of the back face of the substrate 1 excluding the region wherein the SiO$_2$ insulating film 9 is formed is not more than 40%, the efficiency of light extraction can be sufficiently raised. However, the area of the n-electrode 6 is preferably not more than 25%, more preferably not more than 15% the area of the rear surface of the substrate 1.

In the first embodiment, since the distance t between the n-electrode 6 and the light emitting layer 3 is about 100 µm, L=10 t. The proportion of the area of the n-electrode 6 to the area of the rear surface of the substrate 1 is about 22%. As a result, the light emitting wavelength at 20 mA is 408 mm, and the external quantum efficiency is 35%, which means that a very high light emitting efficiency can be obtained.

Second Embodiment

Figure 4:
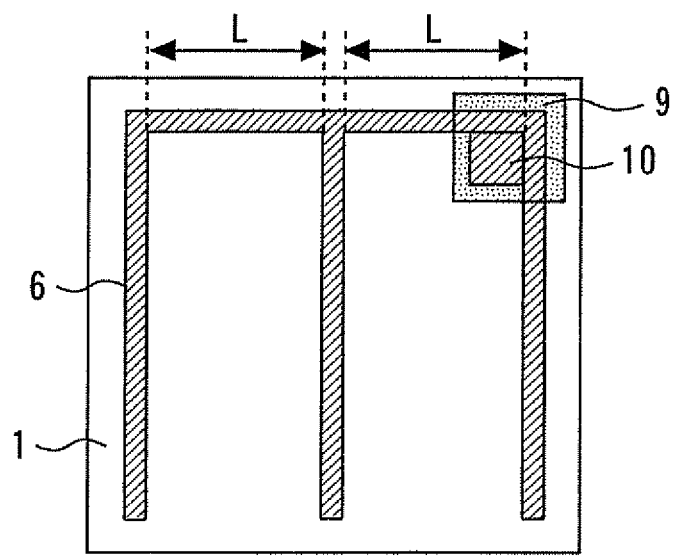
FIG. 4 is a diagram of a semiconductor light-emitting diode according to the second embodiment of the present invention when viewing from the back face.

FIG. 4 is a diagram of a semiconductor light-emitting diode according to the second embodiment of the present invention when viewing from the back face. The size of the element is 400 µm×400 µm. The n-electrode 6 is comb-shaped, the width of the n-electrode 6 is 15 µm, and the width L of an opening is 150 µm. The size of the electrode pad 10 is 50 µm×50 µm, and the size of the SiO$_2$ insulating film 9 is 60 µm×60 µm. Since the laminate structure of the element is the same as in the first embodiment, the description thereof will be omitted.

In the second embodiment, L=1.5 t, and the proportion of the area of the n-electrode 6 to the area of the rear surface of the substrate 1 is about 13%. As a result, the light emitting wavelength at 20 mA is 408 mm, and the external quantum efficiency is 38%, which means that a very high light emitting efficiency can be obtained.

Third Embodiment

Figure 5:
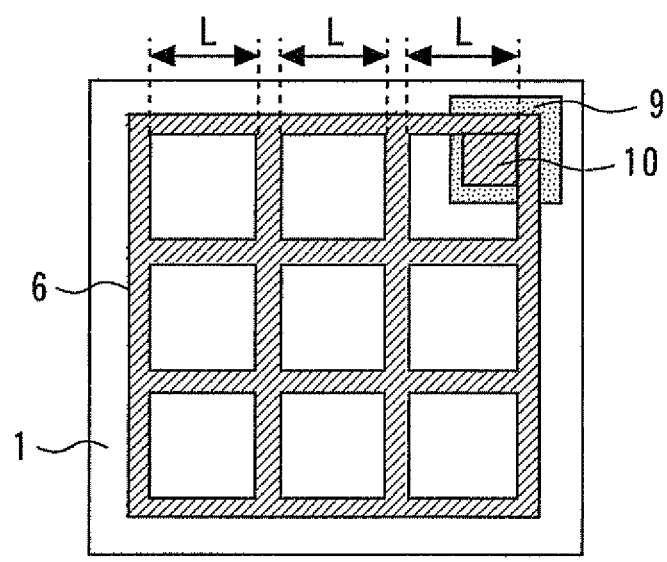
FIG. 5 is a diagram of a semiconductor light-emitting diode according to the third embodiment of the present invention when viewing from the back face.
Figure 6:
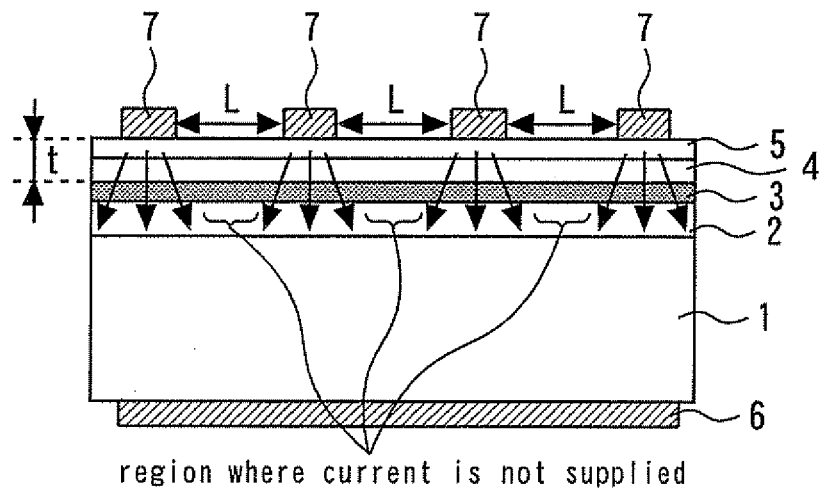
FIGS. 6-9 are a sectional view showing a conventional semiconductor light-emitting diode.
Figure 7:
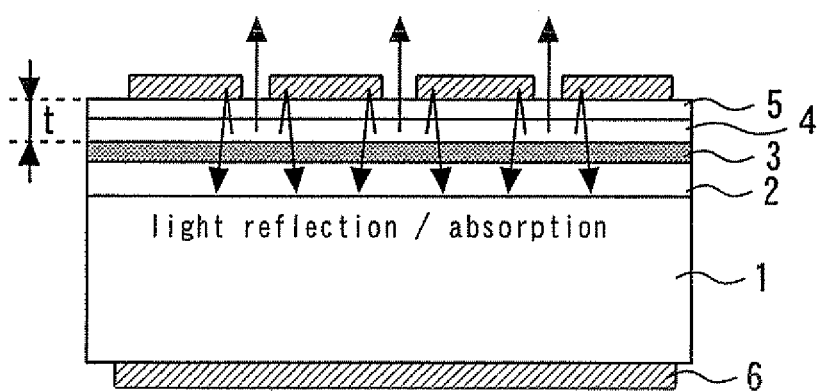
Figure 8:
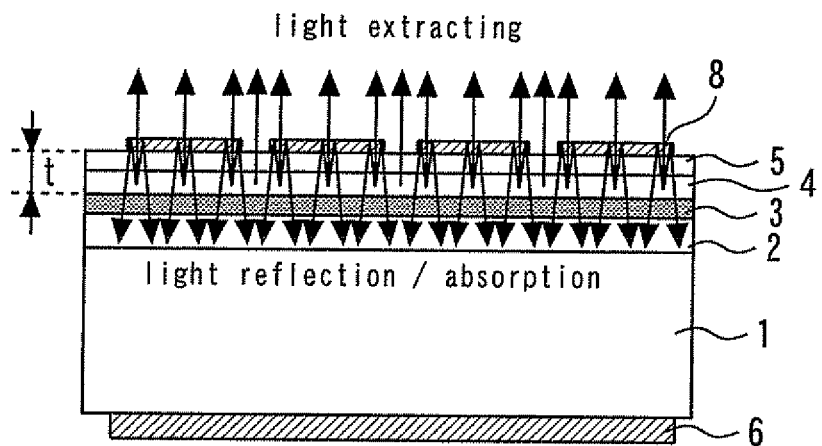
Figure 9:
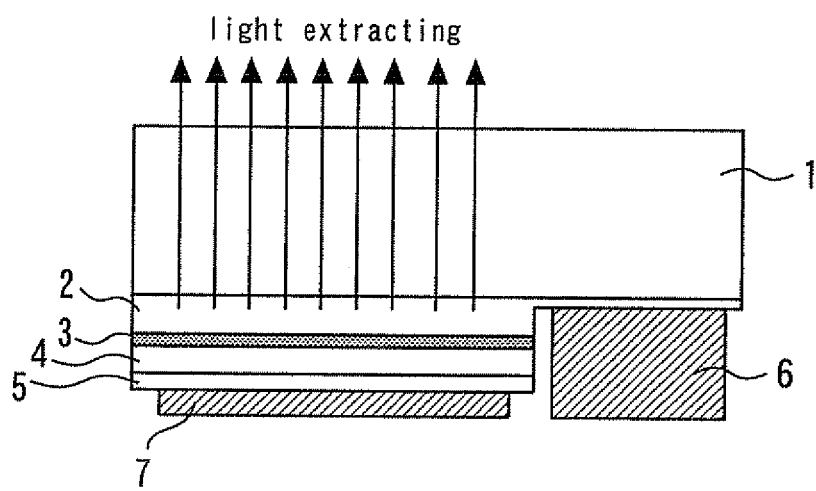

FIG. 5 is a diagram of a semiconductor light-emitting diode according to the third embodiment of the present invention when viewing from the back face. The size of the element is 400 µm×400 µm. The n-electrode 6 is net-shaped, the width of the n-electrode 6 is 20 µm, and the width L of an opening is 100 µm. The size of the electrode pad 10 is 50 µm×50 µm, and the size of the SiO$_2$ insulating film 9 is 60 µm×60 µm. Since the laminate structure of the element is the same as in the first embodiment, the description thereof will be omitted.

In the third embodiment, L=1.0 t, and the proportion of the area of the n-electrode 6 to the area of the rear surface of the substrate 1 is about 34%. As a result, the light emitting wavelength at 20 mA is 408 mm, and the external quantum efficiency is 31%, which means that a very high light emitting efficiency can be obtained.

In the above-described first to third embodiments, the cases wherein the n-electrodes 6 were a comb shaped or a net shaped were described. However, the present invention is not limited thereto, but it is needless to say that the same effect can be achieved if the relationship between the width I of the opening and the distance t, and the proportion of the area of the n-electrode to the area of the rear surface of the substrate 1 satisfies the above-described conditions, even if the n-electrodes 6 has other shapes.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-196260, filed on Jul. 18, 2006 and No. 2007-158344, filed on Jun. 15, 2007 including specification, claims, drawings and summary, on which the Convention priority of the present application is based, are incorporated herein by reference in its entirety.

What is claimed is:

1. A semiconductor light-emitting diode comprising:
an electrically conductive substrate that is transmissive to light at wavelengths emitted by the light-emitting diode and that has front and rear surfaces,
a plurality of semiconductor layers, including a light-emitting layer, on the front surface of said substrate;
a principal-surface electrode on said semiconductor layers with said semiconductor layers sandwiched between said substrate and said principal-surface electrode; and
a rear-surface electrode having an area and an opening, on the rear surface of said substrate, wherein
said opening has a width L,
distance between said rear-surface electrode and said light-emitting layer is t,
L ≤2 t, and
said rear-surface electrode covers no more than 40% of the rear surface of said substrate.

2. The semiconductor light-emitting diode according to claim 1, wherein said rear-surface electrode covers no more than 25% of the rear surface of said substrate.

3. The semiconductor light-emitting diode according to claim 1, wherein said rear-surface electrode covers no more than 15% of the rear surface of said substrate.

4. A semiconductor light-emitting diode comprising:
an electrically conductive substrate that is transmissive to light at wavelengths emitted by the light-emitting diode and that has front and rear surfaces,
a plurality of semiconductor layers including a light-emitting layer, on the front surface of said substrate;
a principal-surface electrode on said semiconductor layers with said semiconductor layers sandwiched between said substrate and said principal-surface electrode;
a rear-surface electrode having an area and an opening, on the rear surface of said substrate;
an insulating film on the rear surface of said substrate; and
an electrode pad on said insulating film and connected to said rear-surface electrode, wherein
said opening has a width L,
distance between said rear-surface electrode and said light-emitting layer is t,
L ≤2 t, and
said rear-surface electrode covers a region, excluding said insulating film, of no more than 40% of the rear surface of said substrate, excluding said insulating film.

5. The semiconductor light-emitting diode according to claim 4, wherein said rear-surface electrode covers a region, excluding said insulating film, of no more than 25% of the rear surface of said substrate, excluding said insulating film.

6. The semiconductor light-emitting diode according to claim 4, wherein said rear-surface electrode covers a region excluding said insulating film, of no more than 15% of the rear surface of said substrate, excluding said insulating film.

7. The semiconductor light-emitting diode according to claim 1, wherein L ≤1.5 t.

8. The semiconductor light-emitting diode according to claim 4, wherein L ≤1.5 t.

9. The semiconductor light-emitting diode according to claim 1, wherein L ≤1.0 t.

10. The semiconductor light-emitting diode according to claim 4, wherein L ≤1.0 t.

11. A semiconductor light-emitting diode comprising:
an electrically conductive substrate that is transmissive to light at wavelengths emitted by the light-emitting diode and that has front and rear surfaces,
a plurality of semiconductor layers including a light-emitting layer, on the front surface of said substrate;

a principal-surface electrode on said semiconductor layers with said semiconductor layers sandwiched between said substrate and said principal-surface electrode; and a plurality of rear-surface electrodes on the rear surface of said substrate, wherein distance between adjoining rear-surface electrodes is L, distance between said plurality of rear-surface electrodes and said light-emitting layer is t, $L \leq 2t$, and said plurality of rear-surface electrodes covers no more than 40% of the rear surface of said substrate.

12. The semiconductor light-emitting diode according to claim 1, wherein said rear-surface electrode has a comb shape.

13. The semiconductor light-emitting diode according to claim 4, wherein said rear-surface electrode has a comb shape.

14. The semiconductor light-emitting diode according to claim 11, wherein said plurality of rear-surface electrodes have a comb shape.

15. The semiconductor light-emitting diode according to claim 1, wherein said rear-surface electrode has a net shape.

16. The semiconductor light-emitting diode according to claim 4, wherein said rear-surface electrode has a net shape.

17. The semiconductor light-emitting diode according to claim 11, wherein said plurality of rear-surface electrodes have a net shape.

18. The semiconductor light-emitting diode according to claim 1 wherein said principal-surface electrode and said rear-surface electrode sandwich said substrate and said plurality of semiconductor layers.

19. The semiconductor light-emitting diode according to claim 4 wherein said principal-surface electrode and said rear-surface electrode sandwich said substrate and said plurality of semiconductor layers.

20. The semiconductor light-emitting diode according to claim 11 wherein said principal-surface electrode and plurality of rear-surface electrode sandwich said substrate and said plurality of semiconductor layers.

* * * * *